US010580867B1

(12) United States Patent
Takeuchi et al.

(10) Patent No.: US 10,580,867 B1
(45) Date of Patent: Mar. 3, 2020

(54) FINFET INCLUDING SOURCE AND DRAIN REGIONS WITH DOPANT DIFFUSION BLOCKING SUPERLATTICE LAYERS TO REDUCE CONTACT RESISTANCE

(71) Applicant: ATOMERA INCORPORATED, Los Gatos, CA (US)

(72) Inventors: Hideki Takeuchi, San Jose, CA (US); Daniel Connelly, San Francisco, CA (US); Marek Hytha, Brookline, MA (US); Richard Burton, Phoenix, AZ (US); Robert J. Mears, Wellesley, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 16/192,930

(22) Filed: Nov. 16, 2018

(51) Int. Cl.
| | | |
|---|---|---|
| *H01L 29/15* | (2006.01) | |
| *H01L 21/283* | (2006.01) | |
| *H01L 29/08* | (2006.01) | |
| *H01L 29/78* | (2006.01) | |
| *H01L 21/225* | (2006.01) | |
| *H01L 29/45* | (2006.01) | |

(Continued)

(52) U.S. Cl.
CPC ........ *H01L 29/152* (2013.01); *H01L 21/2253* (2013.01); *H01L 21/283* (2013.01); *H01L 29/0847* (2013.01); *H01L 29/45* (2013.01); *H01L 29/66795* (2013.01); *H01L 29/785* (2013.01); *H01L 21/26533* (2013.01)

(58) Field of Classification Search
CPC ..... H01L 29/152; H01L 29/785; H01L 29/45; H01L 29/66795; H01L 29/0847; H01L 21/283; H01L 21/2253; H01L 21/26533
See application file for complete search history.

(56) References Cited

U.S. PATENT DOCUMENTS

| | | |
|---|---|---|
| 4,937,204 A | 6/1990 | Ishibashi et al. |
| 5,216,262 A | 6/1993 | Tsu |

(Continued)

FOREIGN PATENT DOCUMENTS

| | | |
|---|---|---|
| GB | 2347520 | 6/2000 |

OTHER PUBLICATIONS

U.S. Appl. No. 15/842,981, filed Dec. 15, 2017 Chen et al.
(Continued)

*Primary Examiner* — William Coleman
(74) *Attorney, Agent, or Firm* — Allen, Dyer, Doppelt, + Gilchrist, P.A.

(57) ABSTRACT

A FINFET may include a semiconductor fin, spaced apart source and drain regions in the semiconductor fin with a channel region extending therebetween, and at least one dopant diffusion blocking superlattice dividing at least one of the source and drain regions into a lower region and an upper region with the upper region having a same conductivity and higher dopant concentration than the lower region. The dopant diffusion blocking superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The semiconductor device may further include a gate on the channel region.

22 Claims, 16 Drawing Sheets

(51) Int. Cl.
  *H01L 29/66* (2006.01)
  *H01L 21/265* (2006.01)

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 8,994,002 B2 * | 3/2015 | Lee | H01L 29/785 257/19 |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 9,941,359 B2 | 4/2018 | Mears et al. | |
| 9,953,874 B2 * | 4/2018 | Chang | H01L 21/823418 |
| 9,972,685 B2 | 5/2018 | Mears et al. | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 2003/0034529 A1 | 2/2003 | Fitzgerald et al. | |
| 2003/0057416 A1 | 3/2003 | Currie et al. | |
| 2006/0197129 A1 | 9/2006 | Wohlmuth | |
| 2006/0220118 A1 | 10/2006 | Stephenson et al. | |
| 2006/0267130 A1 | 11/2006 | Rao | |
| 2006/0273299 A1 * | 12/2006 | Stephenson | B82Y 10/00 257/15 |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0258134 A1 | 10/2008 | Mears et al. | |
| 2010/0059737 A1 | 3/2010 | Bhuwalka et al. | |
| 2011/0215919 A1 | 9/2011 | Rao | |
| 2013/0292690 A1 | 11/2013 | Ando et al. | |
| 2015/0069327 A1 * | 3/2015 | Cheng | H01L 29/158 257/19 |
| 2015/0357414 A1 | 12/2015 | Mears | |
| 2016/0197146 A1 | 4/2016 | Augusto | |
| 2016/0149023 A1 | 5/2016 | Mears et al. | |
| 2016/0358773 A1 | 12/2016 | Mears et al. | |
| 2017/0294514 A1 | 10/2017 | Mears | |
| 2018/0040714 A1 | 2/2018 | Mears et al. | |
| 2018/0040724 A1 | 2/2018 | Mears et al. | |
| 2018/0040725 A1 | 2/2018 | Mears et al. | |
| 2018/0040743 A1 | 2/2018 | Mears et al. | |
| 2018/0052205 A1 | 2/2018 | Roy | |
| 2018/0337063 A1 | 11/2018 | Takeuchi | |
| 2018/0337064 A1 | 11/2018 | Takeuchi | |
| 2018/0358361 A1 | 12/2018 | Rao | |
| 2018/0358442 A1 | 12/2018 | Rao | |
| 2019/0273159 A1 | 9/2019 | Lee et al. | |

OTHER PUBLICATIONS

U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.
U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 16/104,261, filed Aug. 17, 2018 Stephenson et al.
U.S. Appl. No. 16/104,282, filed Aug. 17, 2018 Stephenson et al.
U.S. Appl. No. 16/117,178, filed Aug. 30, 2018 Weeks et al.
U.S. Appl. No. 16/117,202, filed Aug. 30, 2018 Weeks et al.
U.S. Appl. No. 16/176,005, filed Oct. 31, 2018 Weeks et al.
U.S. Appl. No. 16/192,897, filed Nov. 16, 2018 Connelly et al.
U.S. Appl. No. 16/192,911, filed Nov. 16, 2018 Takeuchi et al.
U.S. Appl. No. 16/192,923, filed Nov. 16, 2018 Takeuchi et al.
U.S. Appl. No. 16/192,941, filed Nov. 16, 2018 Takeuchi et al.
U.S. Appl. No. 16/192,959, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.

(56) References Cited

OTHER PUBLICATIONS

R. Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

Gupta et al., "Contact Resistivity Reduction Through Interfacial Layer Doping in Metal-Interfacial Layer-Semiconductor Contacts," J. Appl. Phys. 113, 234505, Jun. 2013, 9 pgs.

Koike et al., "New Contact Metallization Scheme for FINFET and Beyond," 2018 IEEE 2nd Electron Devices Technology and Manufacturing Conference (EDTM), Conference date Mar. 13-16, 2018, pp. 169-171.

Change et al., "The Effect of Carbon on the Valence Band Offset of Compressively Strained $Si_{1-2x-2y}Ge_xC_y/(100)$ Si Heterojunctions," Appl. Phys. Lett. 70 (12), Mar. 24, 1997, pp. 1557-1559.

\* cited by examiner

FINFET INCLUDING SOURCE AND DRAIN REGIONS WITH DOPANT DIFFUSION BLOCKING SUPERLATTICE LAYERS TO REDUCE CONTACT RESISTANCE

TECHNICAL FIELD

The present disclosure generally relates to semiconductor devices and, more particularly, to semiconductor devices with enhanced contact configurations and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A FINFET may include a semiconductor fin, spaced apart source and drain regions in the semiconductor fin with a channel region extending therebetween, and at least one dopant diffusion blocking superlattice dividing at least one of the source and drain regions into a lower region and an upper region with the upper region having a same conductivity and higher dopant concentration than the lower region. The dopant diffusion blocking superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The semiconductor device may further include a gate on the channel region.

More particularly, the at least one dopant diffusion blocking superlattice may comprise a respective dopant diffusion blocking superlattice for each of the source and drain regions. In an example embodiment, the upper region may be raised above an upper surface of the semiconductor layer. Furthermore, the lower region may comprise a different material than the upper region. By way of example, the lower region may comprise silicon, and the upper region may comprise silicon germanium. In accordance with another example, the lower region may comprise silicon germanium, and the upper region may comprise silicon.

The FINFET may further include a metal contact on the upper region. By way of example, the metal contact may comprise at least one of a titanium, cobalt, nickel and platinum. In addition, the FINFET may also include a semiconductor substrate from which the semiconductor fin extends vertically upward, and an insulator on the semiconductor substrate and on opposite sides of the semiconductor fin. Also by way of example, the base semiconductor monolayers may comprise silicon, and the at least one non-semiconductor monolayer may comprise oxygen.

DETAILED DESCRIPTION

Figure 1:
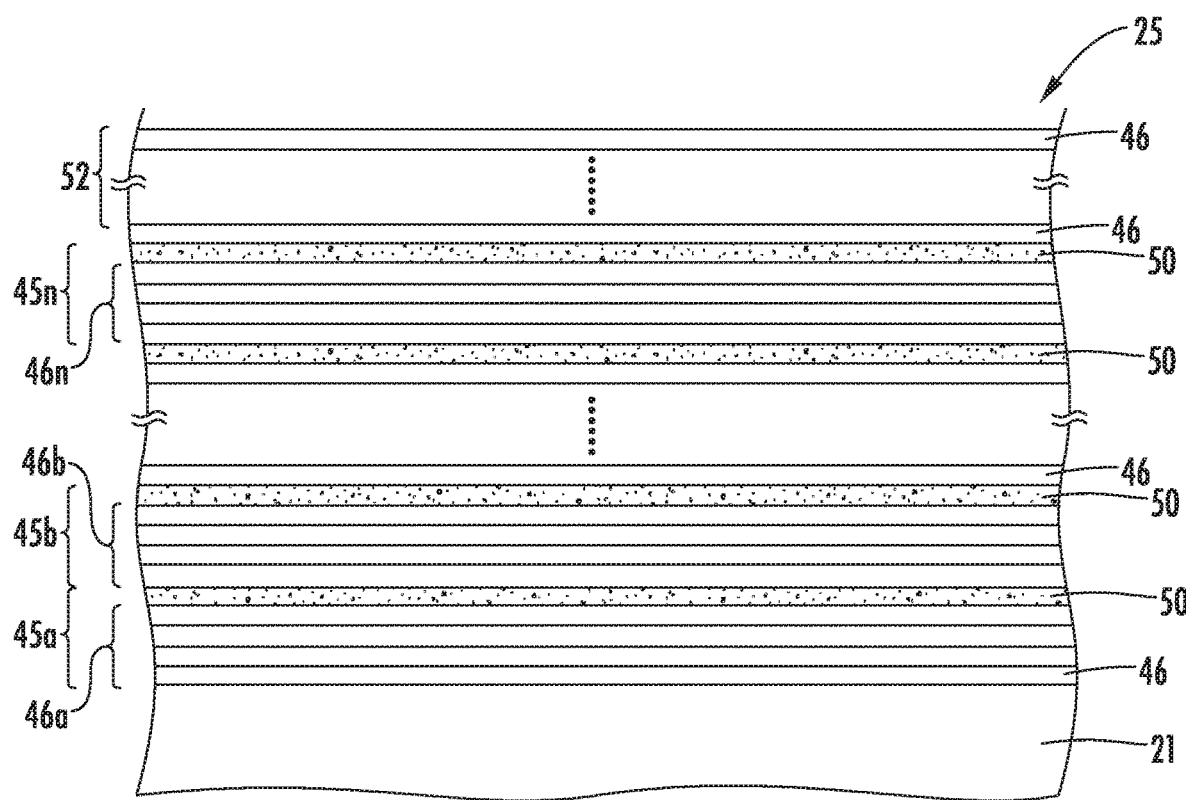
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to utilizing enhanced superlattice materials within source and drain regions to reduce Schottky barrier height and thereby decrease source and drain contact resistance. The enhanced semiconductor superlattice is also referred to as an "MST" layer or "MST technology" in this disclosure and the accompanying drawings.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \\ -\frac{\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
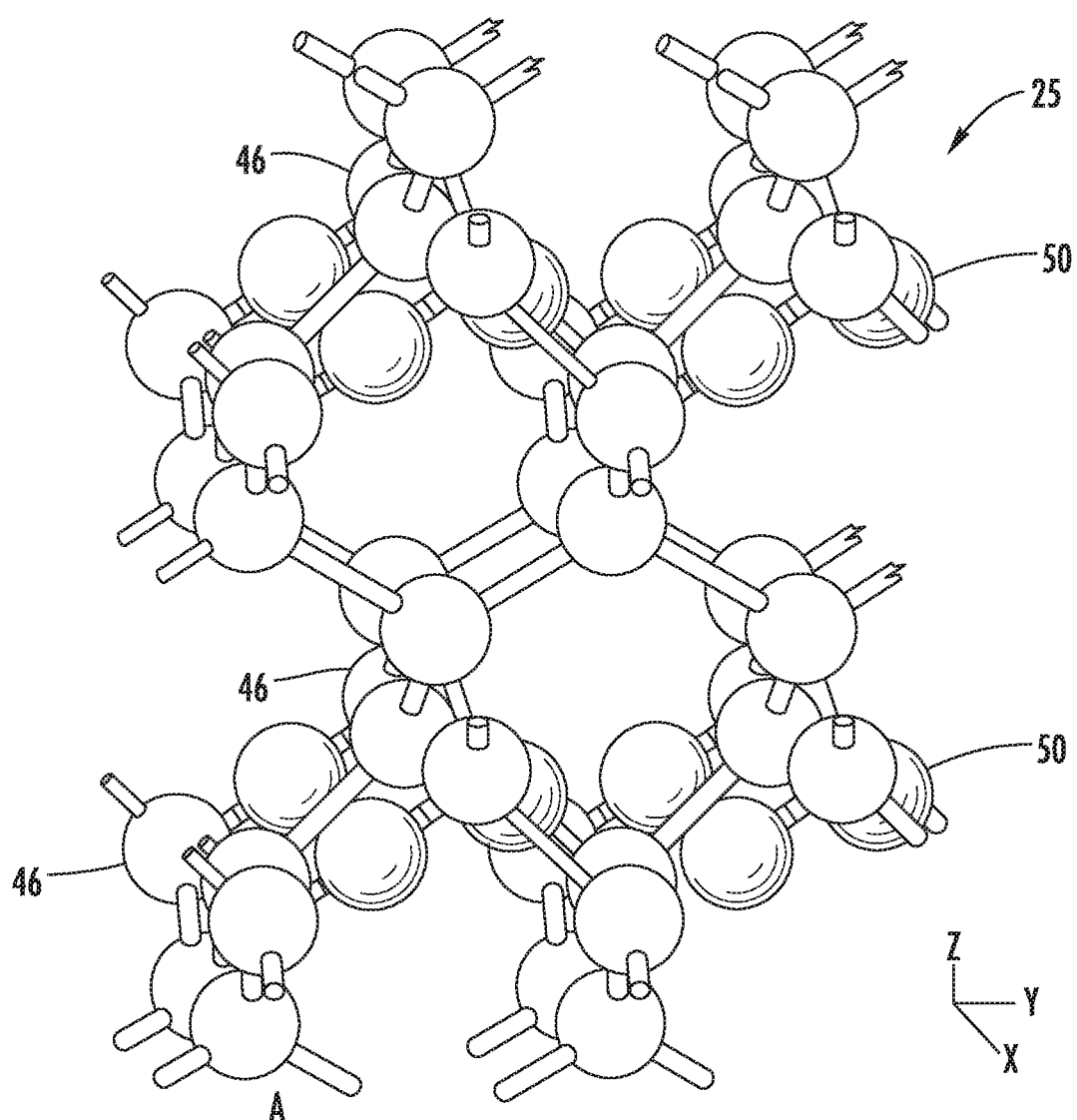
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
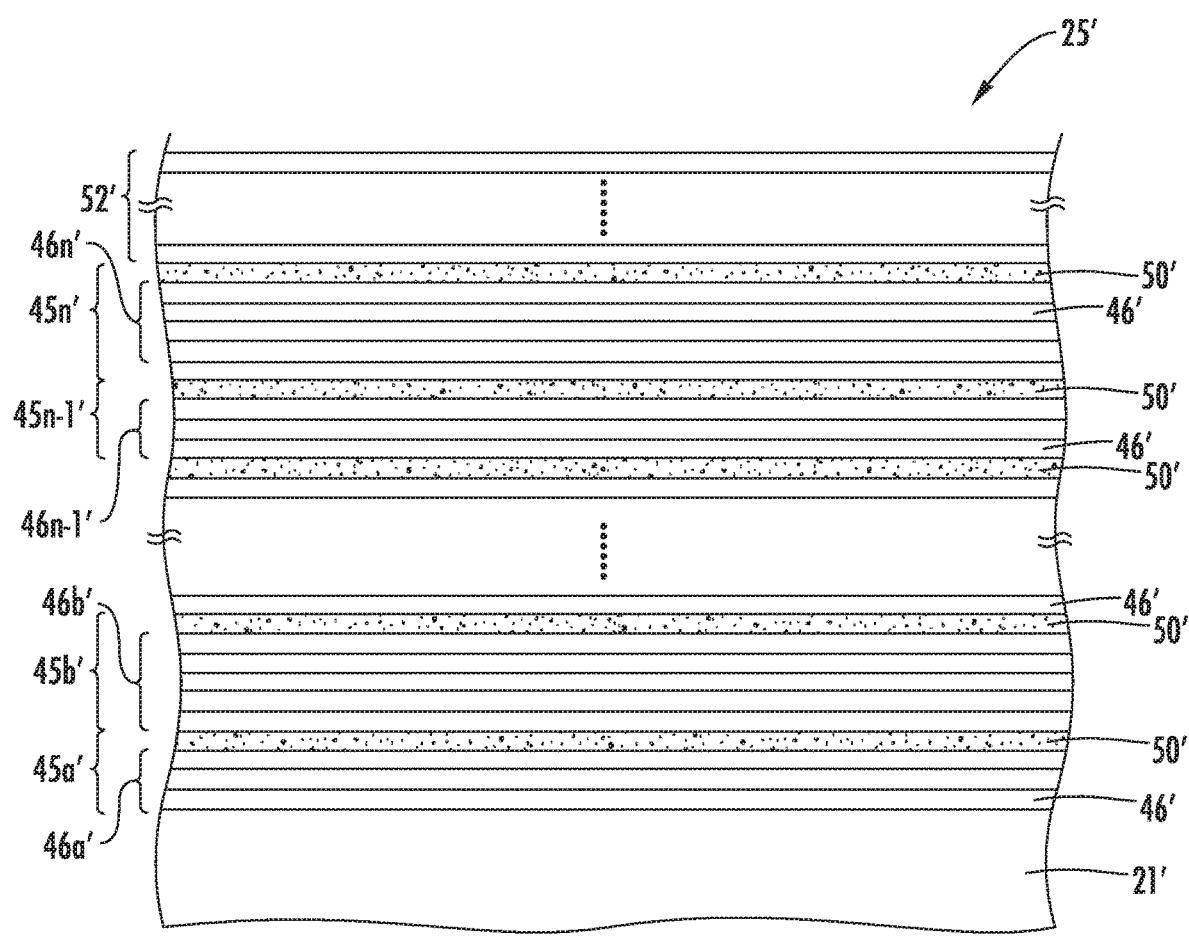
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
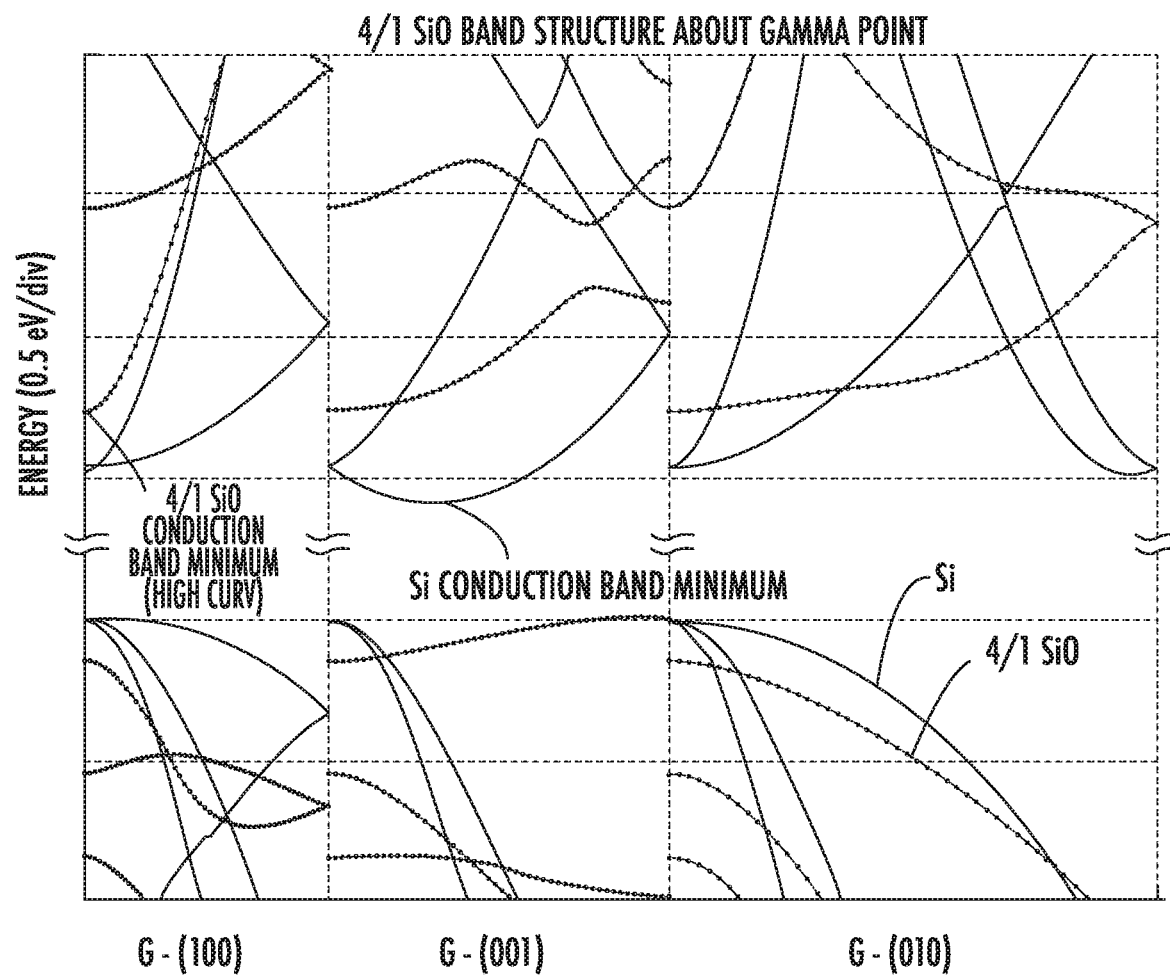
FIG. 4A is a graph of the calculated band structure from the gamma point (G) for both bulk silicon as in the prior art, and for the 4/1 Si/O superlattice as shown in FIGS. 1-2.
Figure 4B:
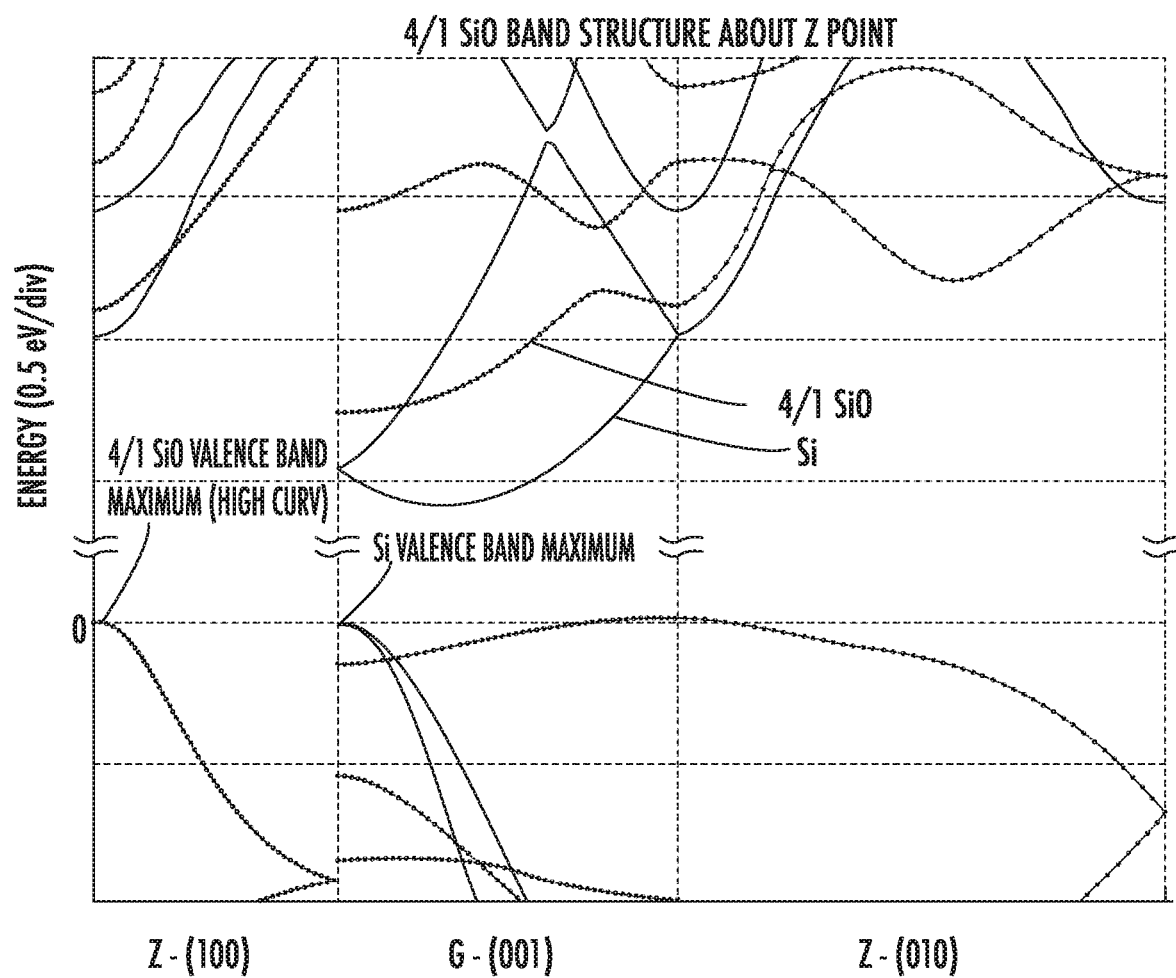
FIG. 4B is a graph of the calculated band structure from the Z point for both bulk silicon as in the prior art, and for the 4/1 Si/O superlattice as shown in FIGS. 1-2.
Figure 4C:
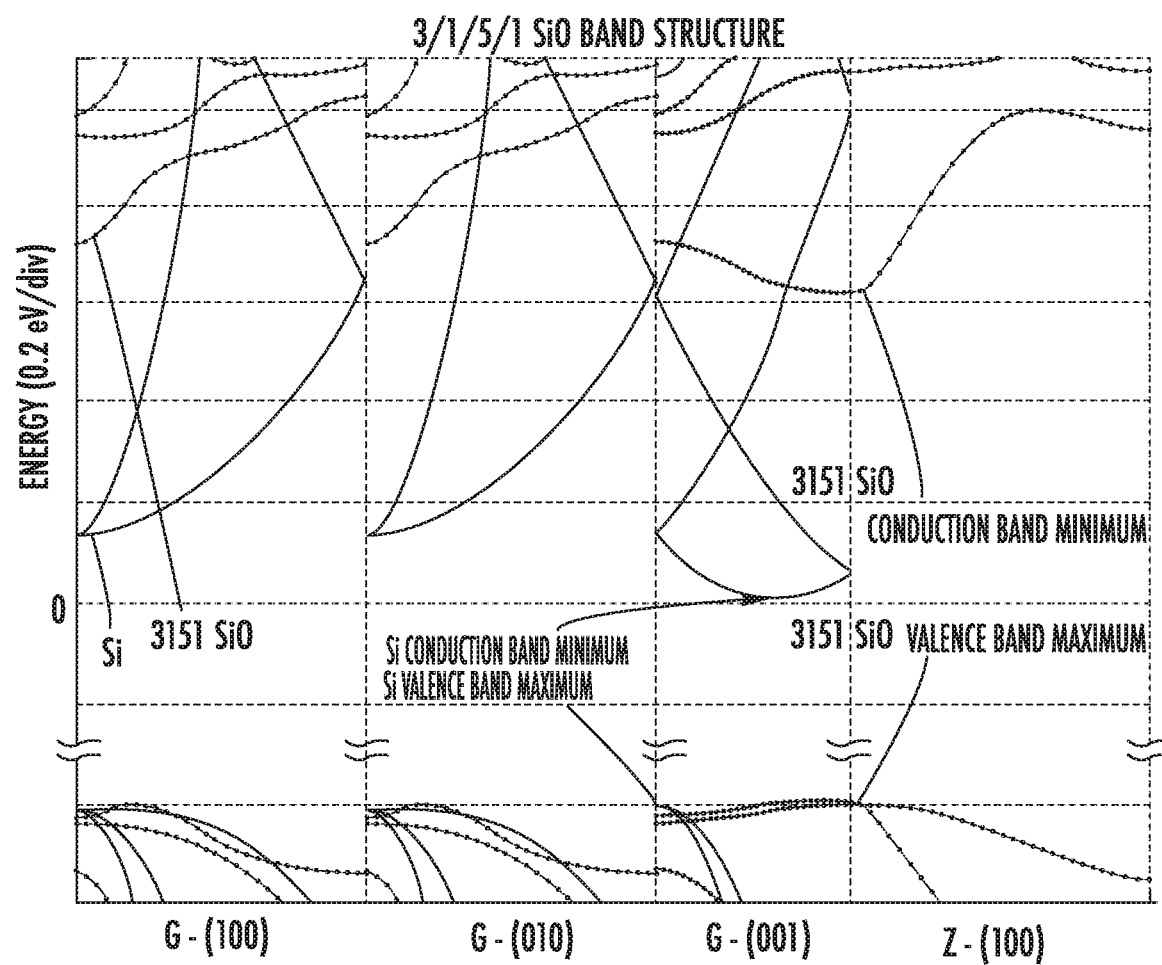
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4O shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Having now described the structure and formation of example MST materials, various embodiments of semiconductor devices and method for their manufacture will now be described which advantageously provide for metal-silicon contacts with proximate dopants using the above-de- scribed MST materials. By way of background, it is typical in semiconductor devices for electrons to be transferred between a semiconductor (such as silicon) and conducting metal "interconnects" which transfer charge between semiconductor devices. Electrical resistance between the semiconductor and metal increases the energy required and reduces the maximum speed of computations and other functions performed by circuits using the devices. It is thus advantageous to minimize this electrical resistance.

When electrons are transferred between a metal and a semiconductor such as silicon, there is a potential barrier encountered by the electron. This barrier is typically referred to as the "Schottky barrier." Electrons can either have sufficient kinetic energy to overcome the Schottky barrier directly, or electrons with lower kinetic energy may pass between the metal and semiconductor via quantum mechanical tunneling. Such tunneling is more likely the spatially thinner the Schottky barrier. A typical way to attain a reduced barrier is to increase the electric field. Higher levels of ionized impurities ("dopants") typically yield higher electric fields and thus increase the tunneling probability, increasing the electron flux between the metal and the semiconductor, thus reducing the effective electrical resistance. But in addition to increasing the electric field, high levels of impurities may additionally reduce the Schottky barrier itself, by reducing the effective band gap of the semiconductor immediately adjacent to the metal-semiconductor interface (and via other chemical effects). This effect is evident from density functional theory calculations.

Oxygen insertion (OI) layers (or other non-semiconductor layers), such as provided in an MST film, for example, may contribute to a lower Schottky and/or thinner barrier by trapping dopants. Density functional theory calculations have shown that OI layers provide for the favorable substitution of specific dopant atoms for silicon atoms within one or two atomic layers of the OI layer. By trapping dopants immediately proximate to, for example, separated by one or two atomic layers from, a metal-semiconductor interface, OI layers may thus contribute to a relatively higher concentration of dopants immediately adjacent to the metal-semiconductor interface, increasing the electric field, and additionally reducing the Schottky barrier.

In addition to trapping dopants, OI layers may immobilize them by trapping point defects that would otherwise aid the diffusion of dopants. So, while an OI layer proximate to a metal-semiconductor layer may trap dopants immediately adjacent to that interface, additional OI layers further from but still proximate to the interface may trap point defects that would otherwise aid in the diffusion of dopants away from the interface. Thus, it may be beneficial to have more than one, for example two, three, or four, OI layers proximate to the interface.

Generally speaking, the embodiments described herein utilize one or more oxygen insertion ("OI" or "MST") layers in close proximity to a metal-semiconductor interface in conjunction with a high (for example, in excess of $10^{21}/cm^3$, or 2% of crystalline sites in the silicon lattice) of ionized impurities such as boron, phosphorus, arsenic, antimony, indium, or gallium in the near proximity (for example, closer than 1 nm) to the metal-silicon interface. Examples of metals include aluminum, tungsten, nickel, titanium, copper, cobalt, indium, gold, platinum, erbium, ytterbium, and compounds of any of these metals with silicon or germanium.

Since the OI layers may provide for favorable substitution by dopant atoms of silicon atoms one or two atomic layers away, the most favorable separation of an OI layer from a metal-semiconductor interface is one or two atomic layers, allowing for the trapping of a high concentration of dopants up to and immediately adjacent to the metal-semiconductor interface. But benefits may also be provided with other separations, for example three, or four atomic layers. Additionally, there may be a benefit in including additional oxygen insertion layers in addition to this first oxygen insertion layer.

Figure 15:
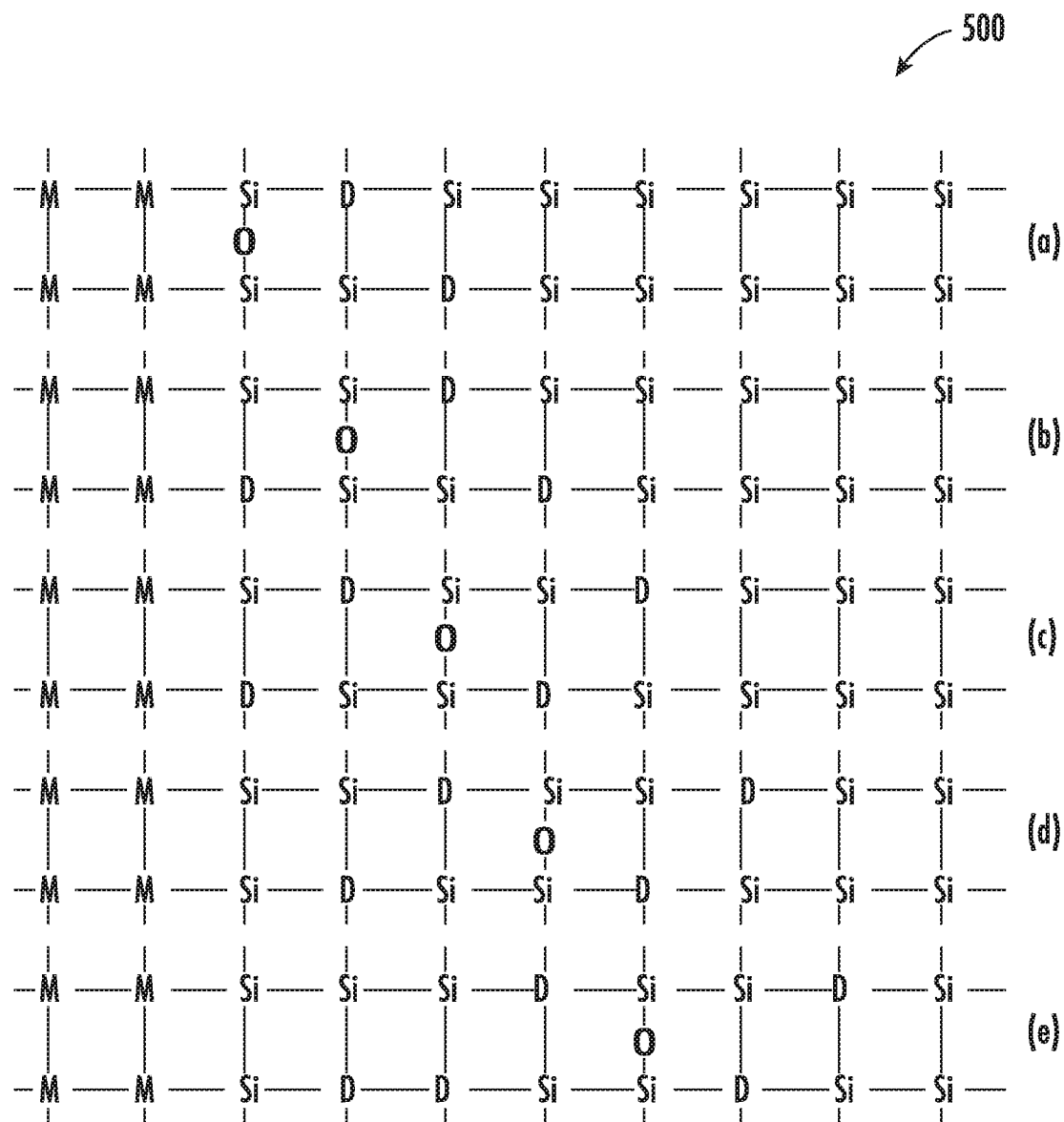
FIG. 15 is a series of schematic atomic level diagrams illustrating approaches by which non-semiconductor insertion layers from the MST films shown in FIGS. 1-4C may be used to provide the metal-semiconductor contacts with proximate dopants for reduced Schottky barrier heights in the embodiments of FIGS. 5-14.

Examples of this approach are represented in the graph 500 of FIG. 15, in which: Si=Silicon atom; M=Metal atom (e.g. titanium); O=Oxygen atom; and D=Dopant atom (e.g. boron). The oxygen atoms as drawn are part of oxygen insertion layers, where the oxygen is bonded with adjacent silicon atoms. While oxygen atoms are necessarily present in the OI layers, there may also additionally be nitrogen atoms, which are not represented in the figure. The presence of nitrogen may be beneficial for the trapping of dopants or for the thermal stability of the OI layers, for example.

Similarly, the represented dopants are replacing silicon atoms in the crystalline lattice, as opposed to occupying "interstitial" positions or in dopant clusters where they will fail to contribute to free carriers in the semiconductor. However, while substitutional dopants are represented in the figure, a high concentration of dopants trapped near the metal-semiconductor interface may reduce a Schottky barrier with alternate atomic configurations. The positions of dopants in the diagram are a schematic representative for illustrational purposes. An actual distribution of dopant atoms will be in part random, influenced by the specific atomic configuration of oxygen atoms, and the local bonding of atoms. The illustrated configurations represent the distance of atoms from the metal-semiconductor interface, not specific positions of atoms within layers. The illustrated configurations are as follows:

(a) OI layer in contact with metal, trapping dopants below the OI layer;

(b) OI layer separated by one atomic layer of silicon from the metal, trapping dopants both above and below the OI layer;

(c) OI layer separated by two atomic layers from the metal, trapping dopants both above and below the OI layer;

(d) OI layer separated by three atomic layers from the metal, trapping dopants both above and below the OI layer, but in this example not reaching the metal interface itself;

(e) OI layer separated by four atomic layers from the metal, trapping dopants both above and below the OI layer, but in this example not reaching the metal interface itself.

In addition to these configurations, additional configurations with multiple OI layers are also possible, for example one layer separated from the metal-semiconductor interface by two silicon layers, and an additional layer separated by an additional four atomic layers. These multiple layers may provide for dopant trapping both at the metal-semiconductor interface, and additionally below the metal-semiconductor interface, the former contributing to chemical Schottky barrier lowering and a higher electric field, the latter contributing primarily through higher electric field. The embodiments set forth herein are generally defined by the presence of a layer proximate to the metal-semiconductor interface in conjunction with a high concentration of dopants, but does not exclude additional layers or dopant atoms not proximate to OI layer(s). A specific advantage of additional OI layers is these additional layers may increase the stability of the structure, for example blocking the loss of oxygen from the layer closest to the metal-semiconductor interface, or trapping point defects which otherwise would contribute to a loss of dopant atoms from the region proximate to the metal-semiconductor interface.

Figure 5:
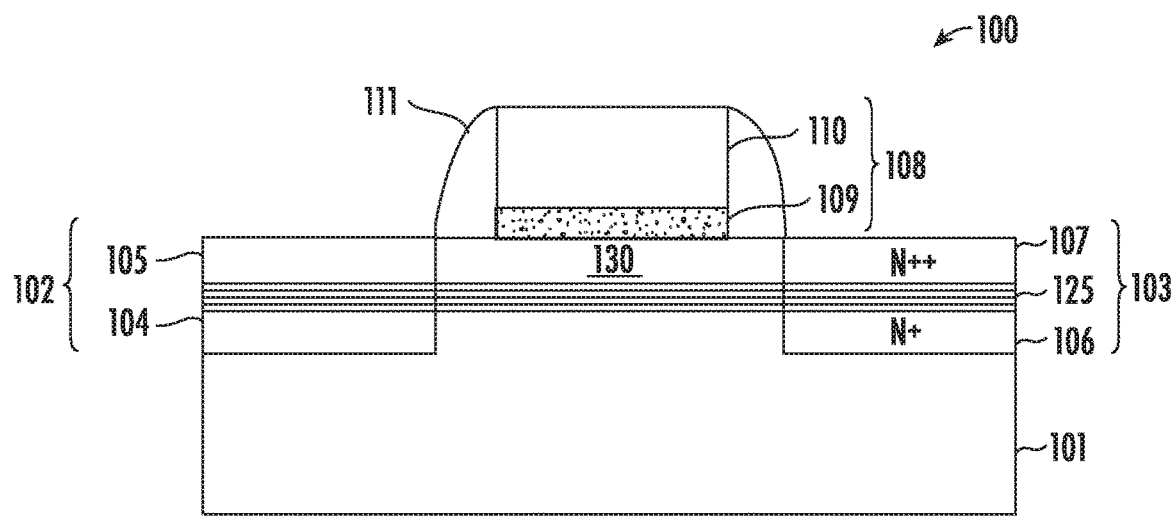
FIG. 5 is schematic cross-sectional diagram of a semiconductor device including a dopant diffusion blocking superlattice dividing the source and drain regions to provide reduced source and drain contact resistance.

Referring now to FIG. 5, the above-described superlattice structures may advantageously be used in semiconductor devices to provide reduced source/drain contact resistance by applying the above-described principles. In typical semiconductor processes, the reduction of metal to semiconductor contact area requires lower contact resistivity (e.g., $p_c$<1E-8 ohm·cm$^2$). Contact resistivity is determined by two parameters, which are:

$N_D$: active dopant concentration at metal/semiconductor interface; and $\Phi F_{Bo}$: Schottky barrier height at metal/semiconductor interface Furthermore, the metal-semiconductor Schottky barrier height is "pinned" for different metals. Moreover, an interfacial insulator can "de-pin" the Fermi level depending on thickness, bandgap, and permittivity.

In the semiconductor device 100 shown in FIG. 5 (a FET), a dopant diffusion blocking superlattice 125 (such as those described above in FIGS. 1-4C) is used to advantageously increase surface dopant concentration to allow a higher $N_D$ during in-situ doped epitaxial processing by preventing diffusion into a channel region 130 of the device. More particularly, the device 100 illustratively includes a semiconductor layer or substrate 101, and spaced apart source and drain regions 102, 103 formed in the semiconductor layer with the channel region 130 extending therebetween. The dopant diffusion blocking superlattice 125 illustratively extends through the source region 102 to divide the source region into a lower source region 104 and an upper source region 105, and also extends through the drain region 103 to divide the drain region into a lower drain region 106 and an upper drain region 107.

The dopant diffusion blocking superlattice 125 may also conceptually be considered as a source dopant blocking superlattice within the source region 102, a drain dopant blocking superlattice within the drain region 103, and a body dopant blocking superlattice beneath the channel 130, although in this configuration all three of these are provided by a single blanket deposition of the MST material across the substrate 101 as a continuous film. The semiconductor material above the dopant blocking superlattice 125 in which the upper source/drain regions 105, 107 and channel region 130 are defined may be epitaxially grown on the dopant blocking superlattice 125 either as a thick superlattice cap layer or bulk semiconductor layer, as discussed further above. In the illustrated example, the upper source/drain regions 105, 107 may each be level with an upper surface of this semiconductor layer (i.e., they are implanted within this layer).

As such, the upper source/drain regions 105, 107 may advantageously have a same conductivity as the lower source/drain regions 104, 106, yet with a higher dopant concentration. In the illustrated example, the upper source/drain regions 105, 107 and the lower source/drain regions 104, 106 are N-type for a N-channel device, but these regions may also be P-type for an P-channel device as well (this applies to other configurations described herein as well). Surface dopant may be introduced by ion implantation, for example. Yet, the dopant diffusion is reduced by the MST film material of the diffusion blocking superlattice 125 because it traps point defects/interstitials introduced by ion implantation which mediate dopant diffusion.

The semiconductor device 100 further illustratively includes a gate 108 on the channel region 130. The gate illustratively includes a gate insulating layer 109 gate electrode 110. Sidewall spacers 111 are also provided in the illustrated example.

Figure 6:
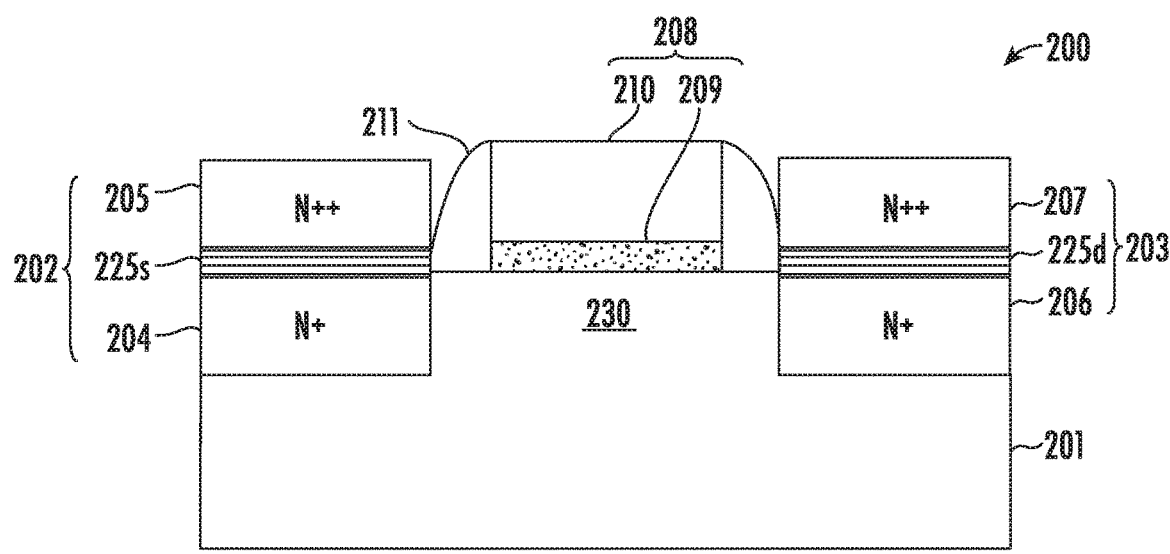
FIG. 6 is schematic cross-sectional diagram of a semiconductor device including source and drain regions divided by respective dopant diffusion blocking superlattices and providing reduced source and drain contact resistance.

Referring now to FIG. 6, in accordance with another example implementation a semiconductor device 200 (FET) illustratively includes a semiconductor layer or substrate 201, and spaced apart source and drain regions 202, 203 with a channel region 230 extending therebetween. In the illustrated embodiment, a source diffusion blocking superlattice 225s illustratively extends through the source region 202 to divide the source region into a lower source region 204 and an upper source region 205. Similarly, a drain diffusion blocking superlattice 225d extends through the drain region 203 to divide the drain region into a lower drain region 206 and an upper drain region 207. Considered alternatively, the upper source and drain regions 205, 207 are each raised above an upper surface of the semiconductor layer 201, and there is no superlattice extending between the source and drain regions 202, 203 as in the example of FIG. 5 (i.e., beneath gate 208). The gate 208 illustratively includes a gate insulator 209 and gate electrode 210, and gate sidewall spacers 211 may also be provided.

In this implementation, the surface dopant in the upper source/drain regions 205, 207 may be introduced by selectively growing MST films, followed by in-situ doped epi film formation. Here again, the MST material of the source/drain dopant diffusion blocking superlattices 225s, 225b advantageously helps prevent dopant diffusion into the channel region 230, and thus allows higher surface dopant concentration as noted above.

Figure 7A:
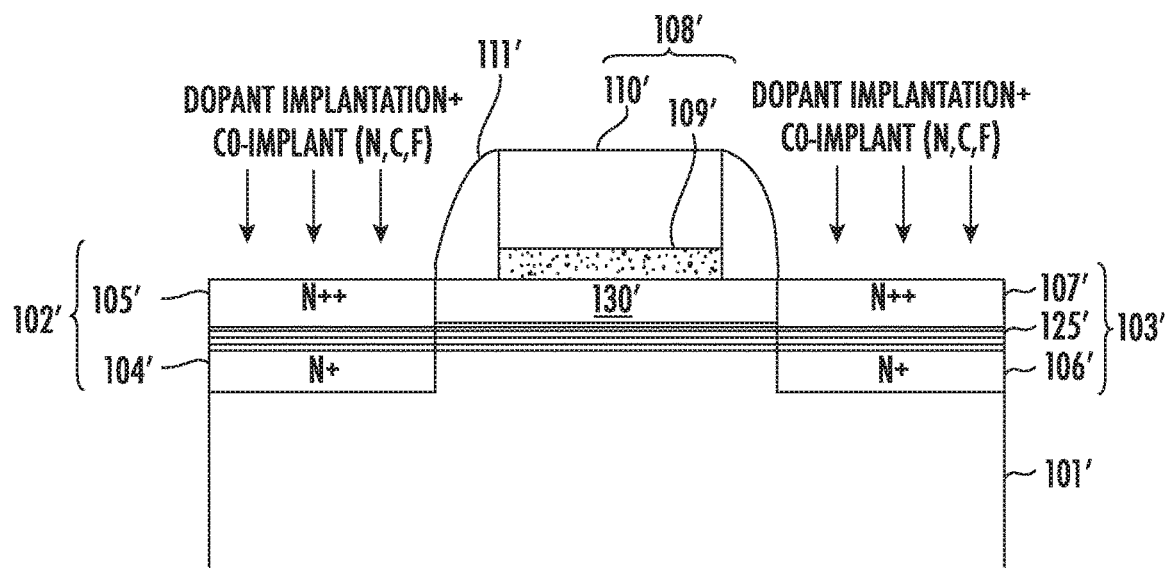
FIGS. 7A-7C are a series of schematic cross-sectional diagrams illustrating a method of making a semiconductor device with interim source and drain superlattice layers to provide Schottky barrier height modulation by controlling interfacial insulator formation.

In accordance with another example implementation now described with reference to FIGS. 7A-7C, further processing steps may be performed to the semiconductor device 100 shown in FIG. 5 to perform Schottky barrier height modulation by controlling a thickness and composition of an interfacial insulator. With traditional metal contacts, too thick of a source/drain insulator results in high contact resistivity due to high tunneling resistance. However, the superlattice 125' advantageously provides desired non-semiconductor (e.g., oxygen) dose control for Fermi-level de-pinning and tunneling resistance. After formation of the gate 108' on the channel region 130', co-implantation of N, C, or F may further modulate insulator composition for lower permittivity (e.g., C and F used for low-k ILD film to modulate $SiO_2$ composition), as illustrated in FIG. 7A. The MST film of the superlattice 125' effectively accumulates these elements into the surface region. It should be noted that in some embodiments N and C may be incorporated into silicon surface by gaseous form (e.g., $N_2$ anneal or CO, $CH_4$ anneal) instead of co-implantation.

Figure 7B:
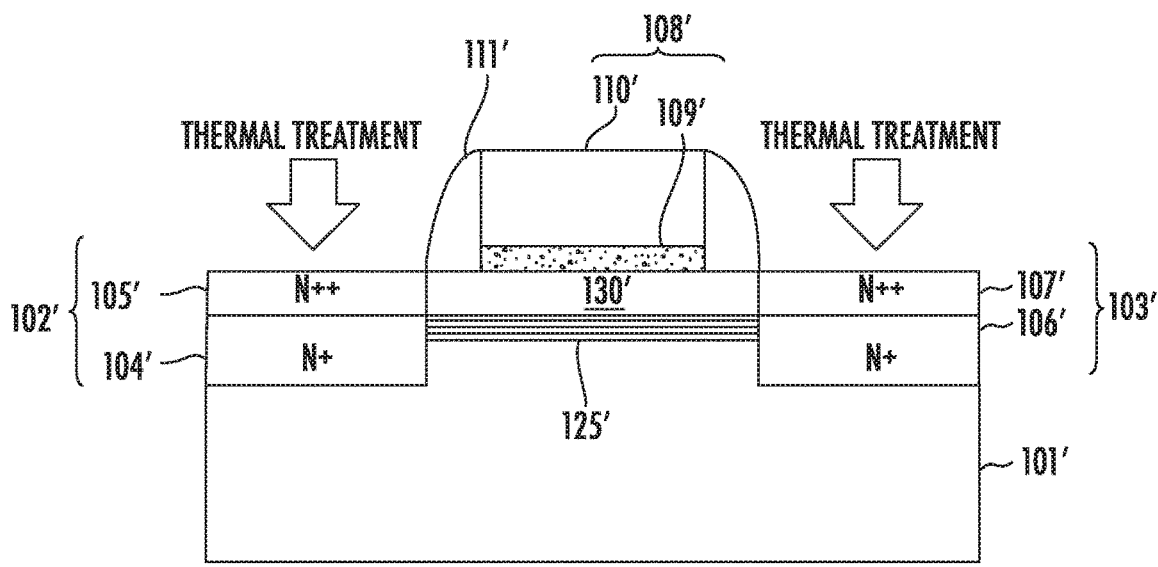
Figure 7C:
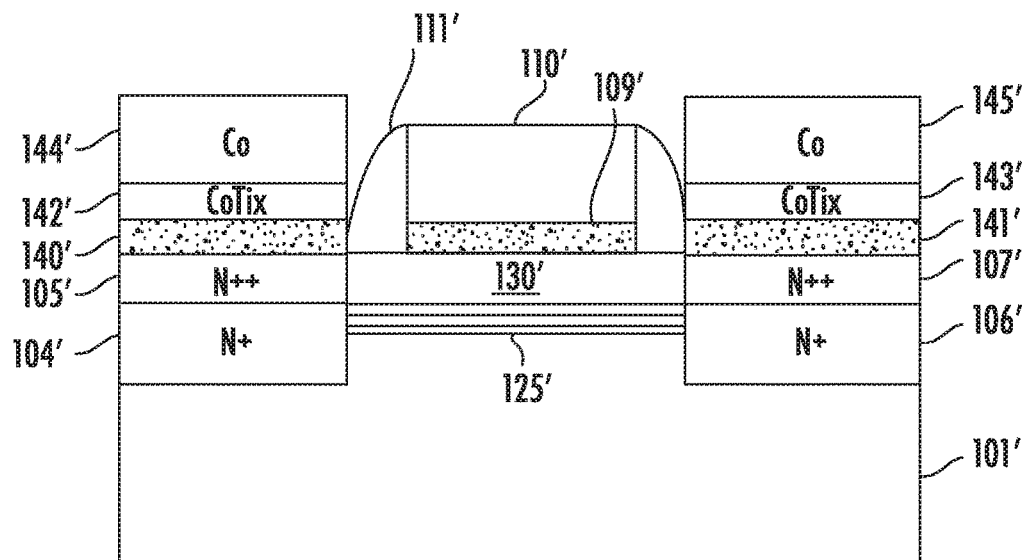

A thermal treatment and metal deposition may then be performed (FIGS. 7B-7C). The thermal treatment moves upward non-semiconductor atoms (oxygen in the present example) from the non-semiconductor monolayers of the dopant diffusion blocking superlattices 125' which react with the metal to form respective source and drain contact insulating interfaces 140', 141' between the upper source and drain regions and adjacent portions of metal layers 142', 143' formed by the metal deposition. Stated alternatively, as the oxygen atoms disassociate from the superlattice 125' in the source and drain regions and move upward to form the contact insulating interfaces 140', 141' so that there is no longer a defined superlattice layer separating the lower/upper source regions 104', 105' and lower/upper drain regions 106', 107' (see FIG. 7B).

In accordance with one example implementation, a Co/Co$_{0.75}$Ti$_{0.25}$ (2 nm) metal deposition may be performed at a temperature in a range of about +200–400 C for approximately 10 min. to form the source and drain contact insulating interfaces 140', 141' and metal layers 142', 143'. Moreover, in some implementations, an additional metal deposition (e.g., Co) may be performed to form upper source/drain metal contact layers 144', 145' in the semiconductor device 100'.

Another example embodiment similar to the semiconductor device 200 is now described with reference to FIG. 8. In this illustrated example, the source and drain dopant diffusion blocking superlattices 225s', 225d' advantageously provide for Schottky barrier height modulation via hetero-epitaxial film integration. More particularly, the lower source and drain regions 204', 206' include a different material than the upper source and drain regions 205', 207'. In this example, the lower source and drain regions 204', 206' are silicon, and the upper source and drain regions 205', 207' are SiGeC, although different materials may be used in different embodiments.

Because the MST material is effective in integrating hetero-epitaxial semiconductor material, incorporation of C(1-2%) to Si or SiGe on Si may induce a positive conduction band offset. More particularly, this is a SiGeC/MST/n+ Si structure that is effective for reducing Schottky barrier height.

Figure 9:
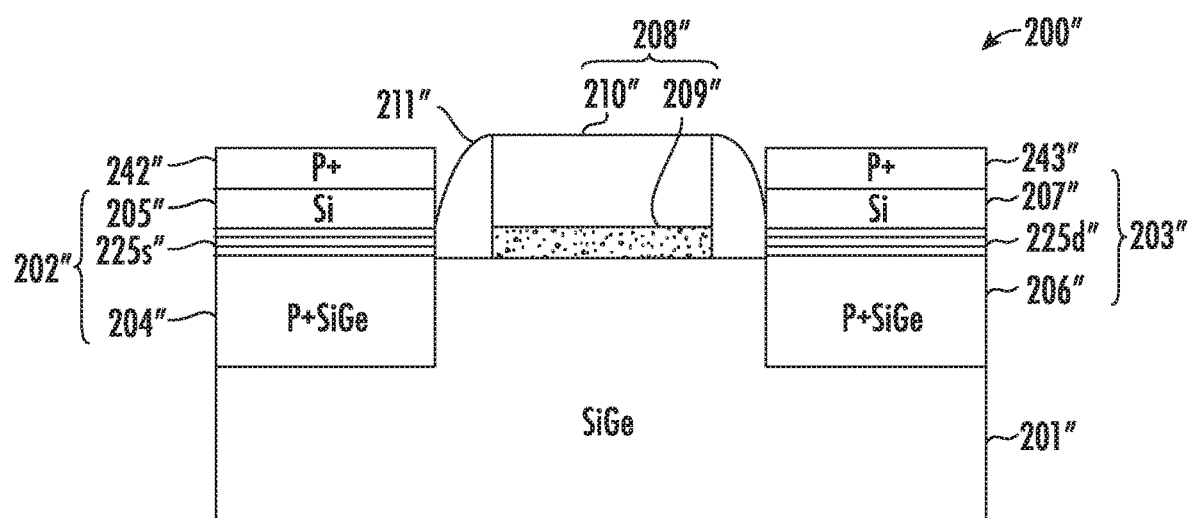

Referring additionally to FIG. 9, another similar semiconductor device 200" advantageously provides for Schottky barrier height modulation via hetero-epitaxial film integration. In the illustrated example, the semiconductor layer/substrate 201" is silicon germanium, and the lower source/drain regions 204", 206" are P+ SiGe. Moreover, the upper source/drain regions 205", 207" are also silicon, and a respective platinum contact layer 242", 243" is formed on each of the upper source/drain regions. The upper source/drain regions 205", 207" may be formed in a relatively thin epitaxial silicon layer (e.g., 2-5 nm). Here again, the MST material is effective in integrating hetero-epitaxial semiconductor material, and strained Si on SiGe (or Ge) may advantageously induce negative valence band offset. As a result, the illustrated s-Si/MST/p+SiGe structure may be effective for reducing Schottky barrier height as well.

Figure 10:
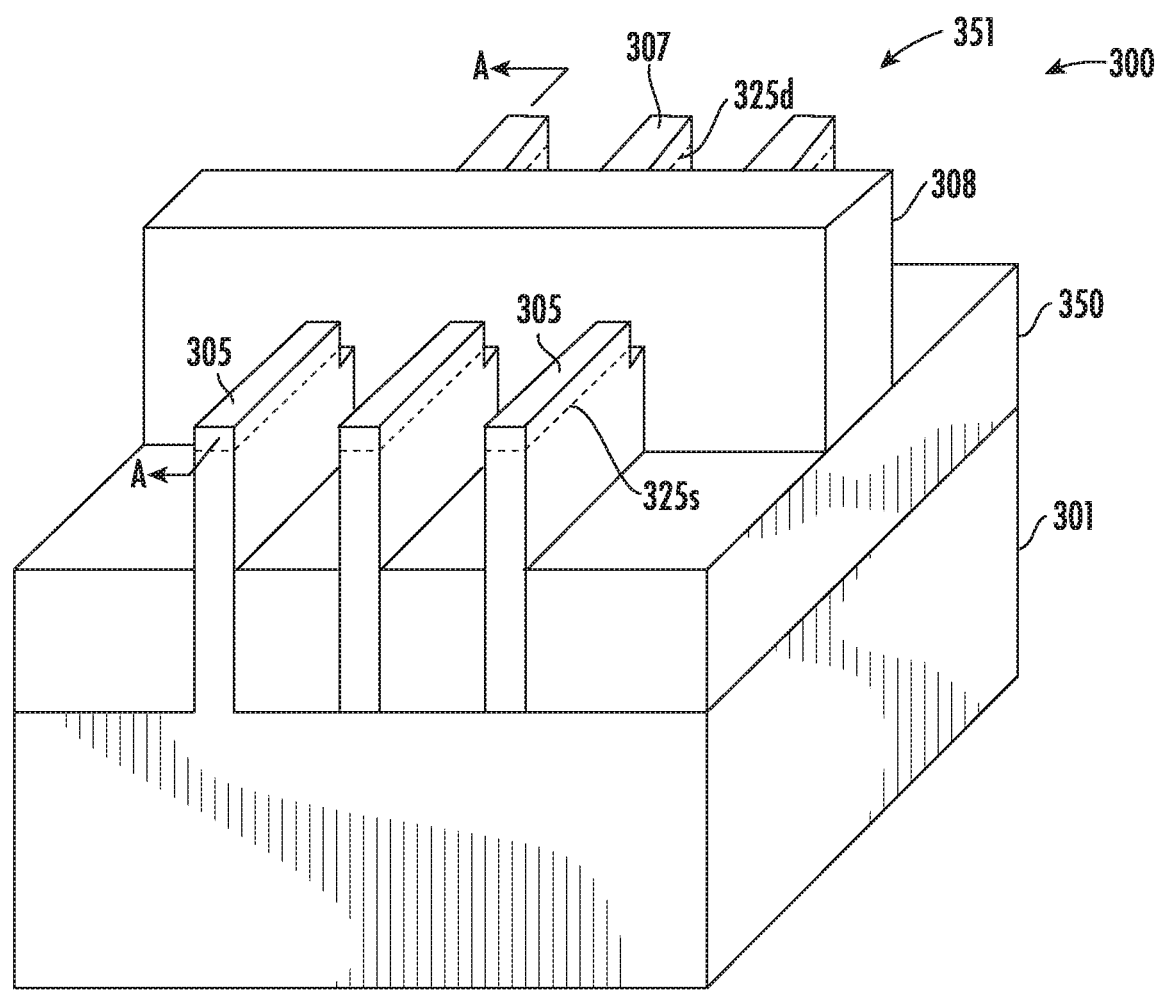
FIG. 10 is a perspective view of a FINFET including source and drain regions divided by respective superlattices and providing reduced source and drain contact resistance.
Figure 11:
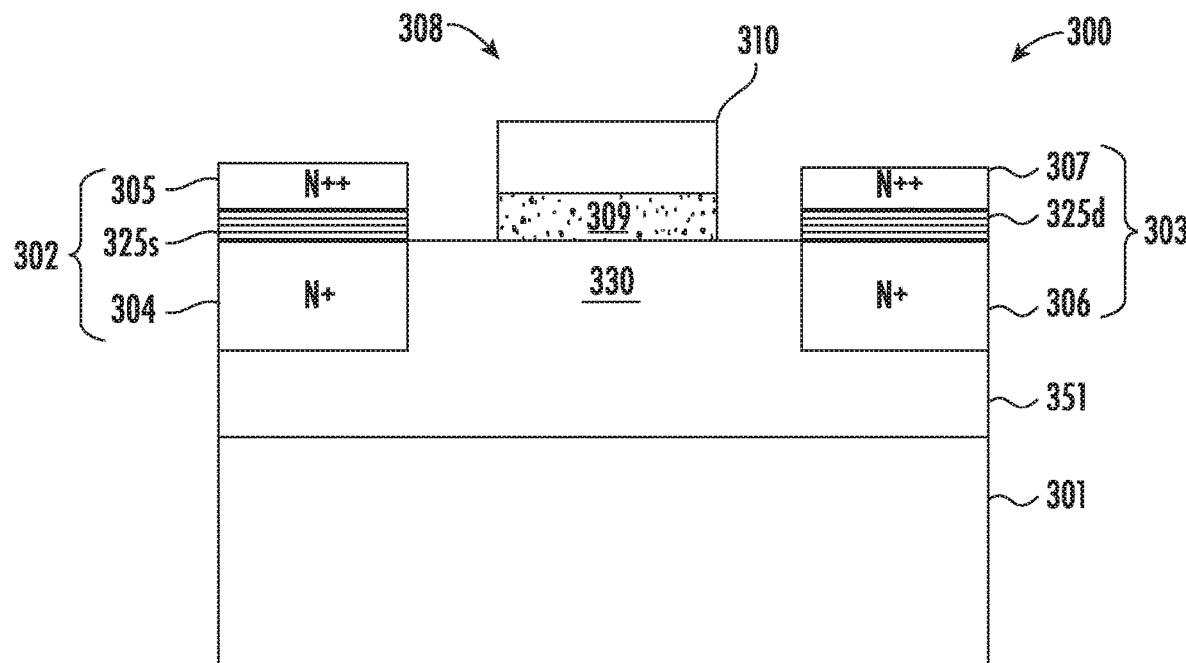
FIG. 11 is cross-sectional view of the FINFET of FIG. 10 taken along line A-A.
Figure 12:
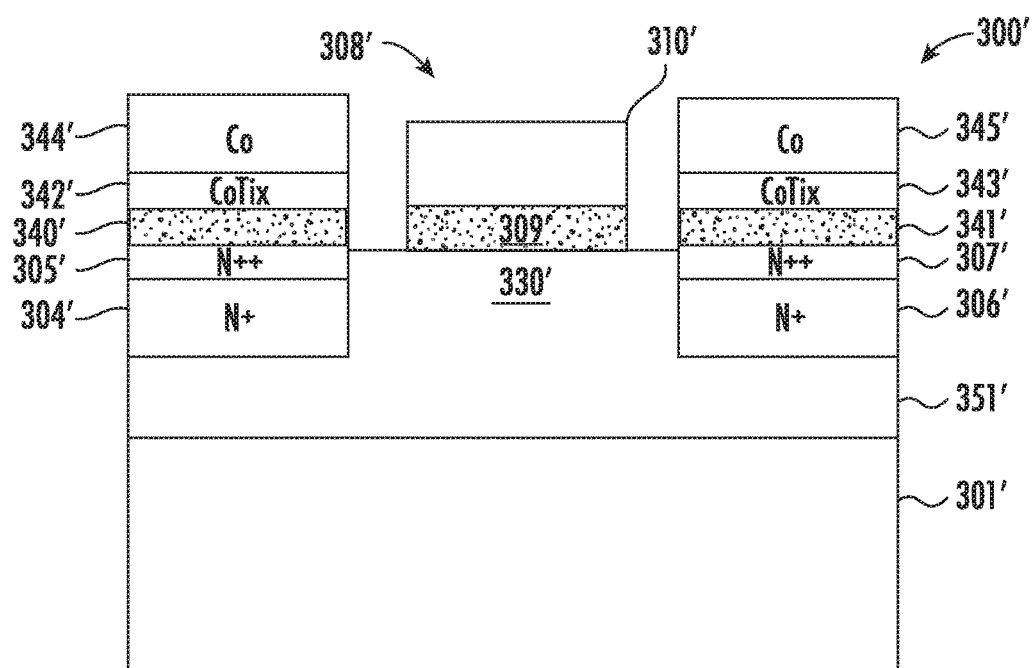
FIG. 12 is a cross-sectional view of an alternative embodiment of the FINFET of FIG. 10 taken along line A-A formed using a similar process to that shown in FIGS. 7A-7O.

Turning now additionally to FIG. 10, certain of the above-described planar FET configurations may also advantageously be implemented in vertical semiconductor devices as well. An example FINFET 300 illustratively includes a semiconductor layer or substrate 301 (e.g., silicon), an insulating layer 350 on the substrate (e.g., SiO$_2$), and one or more semiconductor fins 351 extending vertically upward from the substrate through the insulating layer.

Spaced apart source and drain regions 302, 303 are formed in each semiconductor fin 351 with a channel region 330 extending therebetween. A source dopant diffusion blocking superlattice 325s extends through the source region 302 to divide the source region into a lower source region 304 and an upper source region 305, and a drain dopant diffusion blocking superlattice 325d extends through the drain region 303 to divide the drain region into a lower drain region 306 and an upper drain region 307. Similar to the embodiment of FIG. 6, the upper source/drain regions 305, 307 have a same conductivity and higher dopant concentration (N++) than the lower source/drain regions 304, 306 (N+). Moreover, the upper source/drain regions 305, 307 extend above an upper surface of the semiconductor fin 351. That is, superlattices 325s, 325d may be formed on the top of the semiconductor fin 351, and the upper source/drain regions 305, 307 may be epitaxially grown on the respective superlattices. In this regard, the upper source/drain regions 305, 307 may implanted with a dopant, or they may be in-situ doped epitaxial layers as described above.

The FINFET 300 also illustratively includes a gate 308 overlying the channel regions 330 of the fins 351. The gate 308 illustratively includes a gate insulator 309 and a gate electrode 310 on the gate insulator.

In accordance with another example implementation, a FINFET 300' may be fabricated using a similar process to that described above with respect to FIGS. 7A-7C, i.e., involving a thermal treatment and metal deposition to define source/drain insulating layers 340', 341' between the upper source/drain regions 305', 307' and metal layers 342', 343' (e.g., CoTi$_x$) respectively. Upper metal layers 344', 345' (e.g., Co) may also be formed on the lower metal layers 342', 343' in some embodiments. Here again, the heat treatment causes the non-semiconductor atoms in the source/drain dopant blocking superlattice layers to move upward, leaving no superlattice between the upper source/drain regions 305', 307' and the lower source/drain regions 304', 306' in the final FINFET 300'. Here again, this approach advantageously provides for Schottky barrier height modulation by controlling the thickness and composition of the interfacial insulators 340', 341'.

Figure 8:
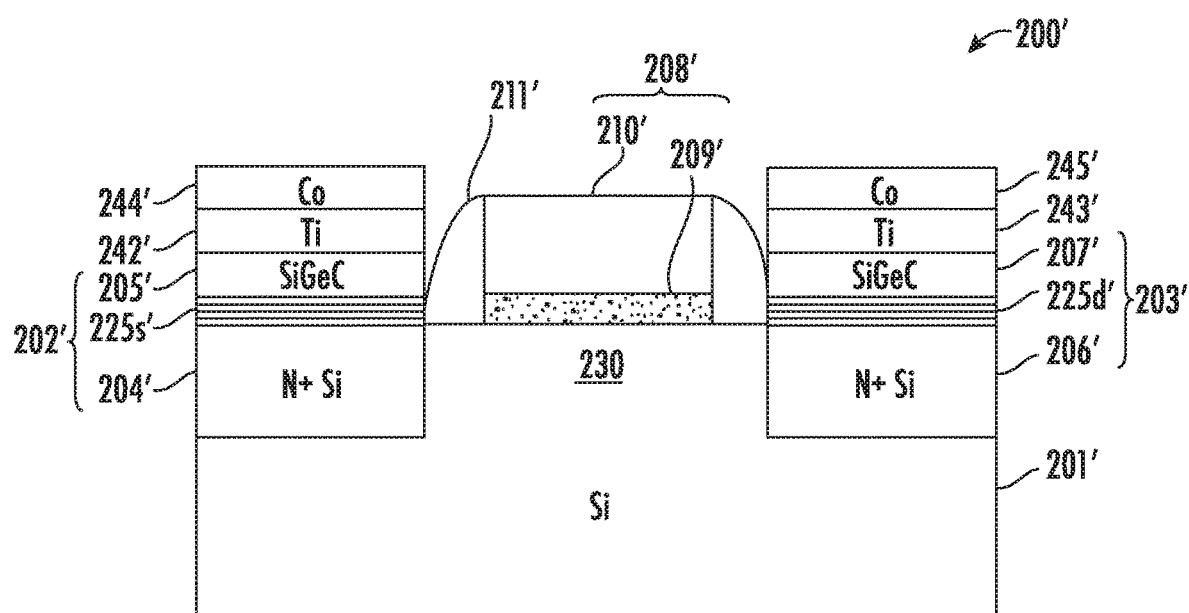
FIGS. 8-9 are a schematic cross-sectional diagrams of example semiconductor devices including source and drain regions divided by respective superlattices and having a different upper and lower semiconductor source/drain materials and metal contact regions.
Figure 13:
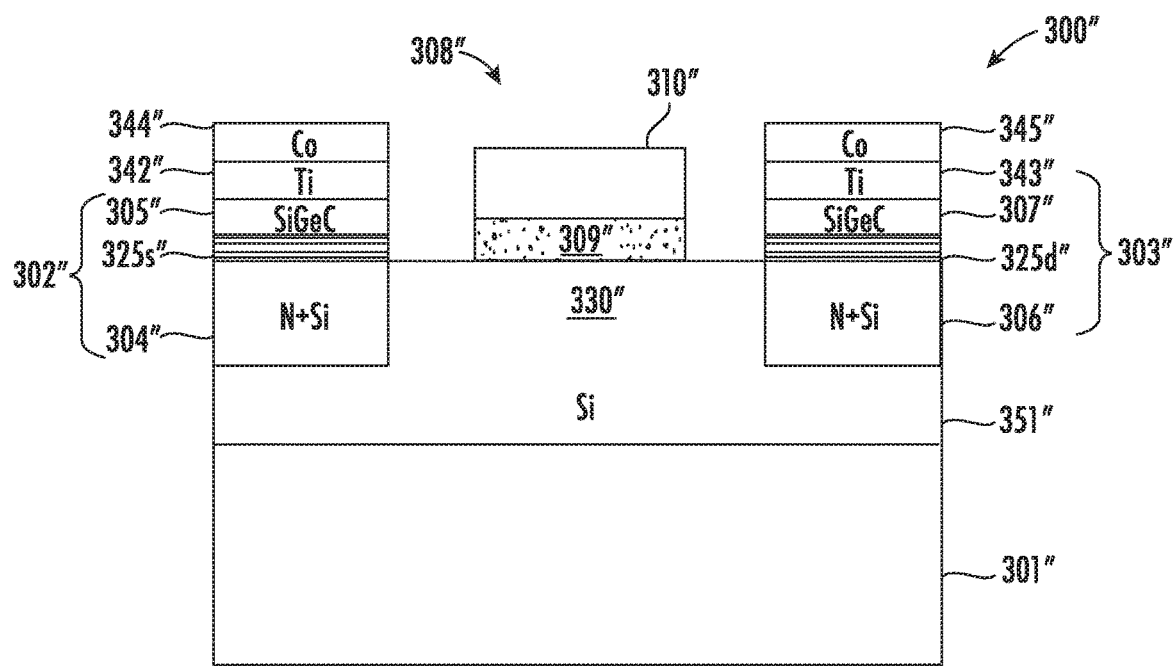
FIGS. 13 and 14 are cross-sectional views of alternative embodiments of the FINFET of FIG. 10 taken along line A-A which includes similar source and drain configurations to the devices of FIGS. 8 and 9, respectively.

Referring additionally to FIG. 13, a FINFET 300" is provided which is similar to embodiment of FIG. 8 above, in that the source and drain dopant blocking superlattices 325s", 325d" advantageously provide for Schottky barrier height modulation via hetero-epitaxial film integration. More particularly, the lower source and drain regions 304", 306" include a different material than the upper source and drain regions 305", 307". In this example, the lower source and drain 304", 306" regions are silicon, and the upper source and drain regions 305", 307" are SiGeC, although different materials may be used in different embodiments. Also, the lower metal layers 342", 342" are titanium, and the upper metal layers 344", 345" are cobalt in the illustrated example.

Figure 14:
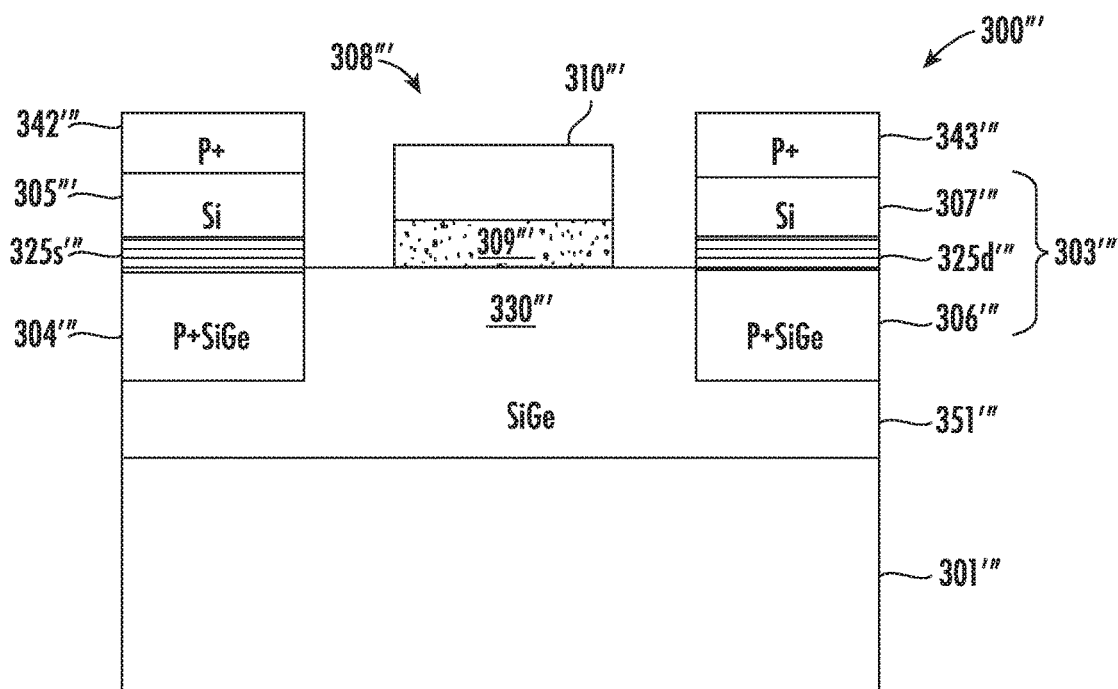

In still another example shown in FIG. 14, similar to the embodiment of FIG. 9 the FINFET 300''' may also provide for Schottky barrier height modulation via hetero-epitaxial film integration. In the illustrated example, the semiconductor fin 351' is silicon germanium, and the lower source/drain regions 304", 306" are P+SiGe. Moreover, the upper source/drain regions 305", 307" are silicon, and a respective platinum contact layer 342", 343" is formed on each of the upper source/drain regions. Here again, the upper source/drain regions 305", 307" may be formed in a relatively thin epitaxial silicon layer (e.g., 2-5 nm).

In the above-described examples, a dopant blocking superlattice is shown in both of the source and drain regions of the illustrated devices. However, it should be noted that in some embodiments both of the source and drain regions need not have a dopant blocking superlattice. That is, the dopant blocking superlattice may be in just one of the source or drain regions in some embodiments.

Figure 16:
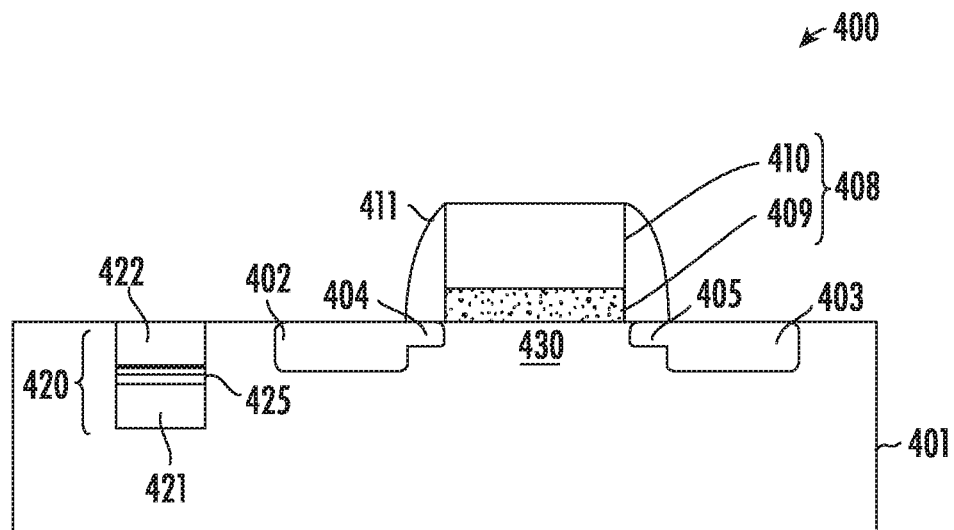
FIG. 16 is a schematic cross-sectional diagram of a semiconductor device including a body contact with a dopant diffusion blocking superlattice to provide reduced contact resistance in accordance with an example embodiment.

Furthermore, turning now to FIG. 16, in some embodiments a dopant blocking superlattice may also be incorporated in a body contact to provide reduced body contact resistance in addition to, or instead of, in the source/drain regions. In the illustrated example, a semiconductor device 400 (here a planar FET) includes a semiconductor layer or substrate 401, spaced apart source and drain regions 402, 403 (which have respective lightly doped source/drain extensions 404, 405 in this example) in the semiconductor layer 401 with a channel region 430 extending therebetween, and a gate 408 on the channel region with sidewall spacers 411. As similarly described above, the gate 408 illustratively includes a gate insulator 409 and a gate electrode 410. The semiconductor device 400 further illustratively includes a body contact 420 in the semiconductor layer 401 and comprising a body contact dopant diffusion blocking superlattice 425 extending through the body contact to divide the body contact into a first body contact region 421 and a second body contact region 422. As similarly described above, the second body contact region 422 has a same conductivity and higher dopant concentration than the first body contact region 421. Here again, the body contact dopant diffusion blocking superlattice 425 may be similar to those superlattice structures described above, and the materials used for, and dopant concentrations within, the first and second body contact regions 421, 422 may also be similar to those described above to provide desired contact resistance reduction.

Figure 17:
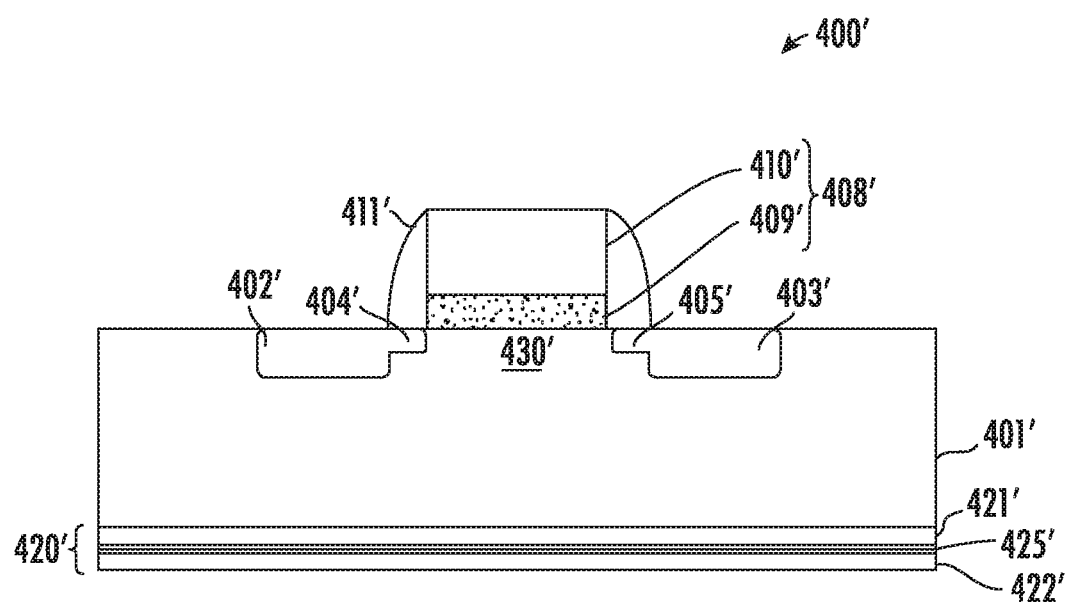
FIG. 17 is a schematic cross-sectional diagram of a semiconductor device including a back side body contact with a dopant diffusion blocking superlattice to provide reduced contact resistance in accordance with an example embodiment.

In another example device 400' shown in FIG. 17, a similar configuration is provided which has a back-side body contact 420' instead of the top-side or front-side body contact 420 shown in FIG. 16. The remaining components are similar to those discussed with reference to FIG. 16 and accordingly require no further discussion herein. It should be noted that in the back-side implementation the first and second regions 421', 422' are flipped vertically with respect to the first and second regions 421, 422 in the device 400, as they are on the opposite side of the device 400'.

Figure 18:
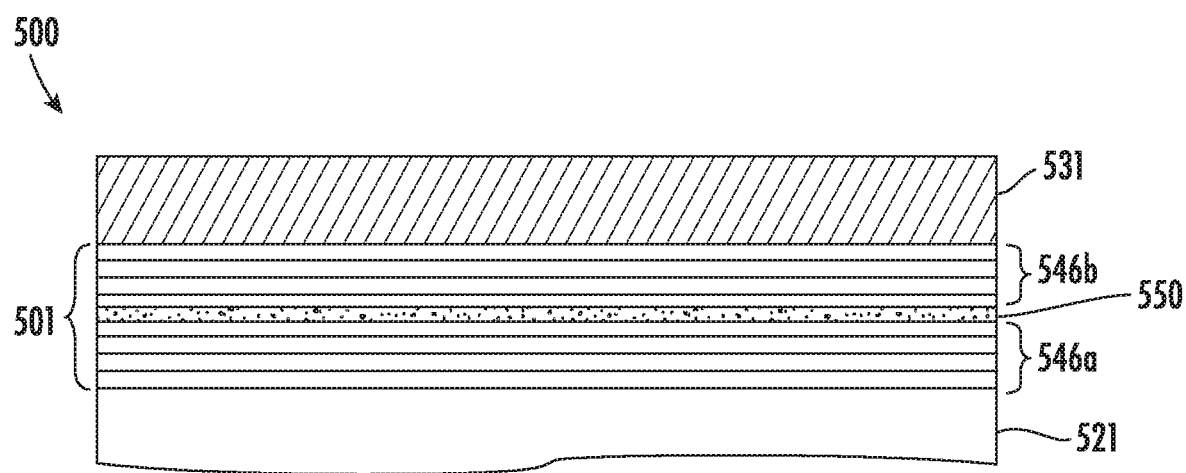
FIG. 18 is a cross sectional view of an alternative contact structure which may be used to provide reduced contact resistance in accordance with an example embodiment.

Turning now to FIG. 18, another example contact structure 500 is now described which may be also be used in certain implementations of source/drain, body, or other contacts to provide reduced Schottky barrier height and thereby decreased contact resistance. The contact 500 is formed in a semiconductor layer 501. The contact illustratively includes one or more oxygen monolayers 550 constrained within a crystal lattice of adjacent semiconductor portions 546a, 546b of the semiconductor layer 501. The oxygen monolayer(s) 550 is and spaced apart from a surface of the semiconductor layer 501 by between one and four monolayers (a four monolayer spacing is shown in the semiconductor portion 546b in the illustrated example). Furthermore, a metal layer 531 (which may include the same metals discussed above) is formed on the surface of the semiconductor layer 501 above the oxygen monolayer(s) 550. The contact 500 may be formed on a semiconductor layer or substrate 521.

By way of example, a dopant concentration within the portion 546b (i.e., between the oxygen monolayer(s) 550 and the metal layer 531) may be $1 \times 10^{21}$ atoms/cm$^3$ or greater (although lower concentrations may also be used in different embodiments). Considered alternatively, a dopant concentration equivalent to approximately 2% of the crystalline sites in a silicon lattice may advantageously be occupied by dopant atoms in an example configuration. This is based upon an estimate for the maximum distance range over which the oxygen monolayer can directly trap dopants (e.g., boron) sufficiently close to the metal to directly reduce the Schottky barrier of the contact, as opposed to reducing diffusion, yet while otherwise retaining a conventional doped metal-semiconductor interface with a bulk-line environment for the dopant atoms, and the minimum concentration of dopants where a benefit will be realized.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A FINFET comprising:
    a semiconductor fin;
    spaced apart source and drain regions in the semiconductor fin with a channel region extending therebetween;
    at least one dopant diffusion blocking superlattice dividing at least one of the source and drain regions into a lower region and an upper region with the upper region having a same conductivity and higher dopant concentration than the lower region;
    the dopant diffusion blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and
    a gate on the channel region.

2. The FINFET of claim 1 wherein the at least one dopant diffusion blocking superlattice comprises a respective dopant diffusion blocking superlattice for each of the source and drain regions.

3. The FINFET of claim 1 wherein the upper region is raised above an upper surface of the semiconductor layer.

4. The FINFET of claim 1 wherein the lower region comprises a different material than the upper region.

5. The FINFET of claim 1 further comprising a metal contact on the upper region.

6. The FINFET of claim 1 further comprising a semiconductor substrate from which the semiconductor fin extends vertically upward, and an insulator on the semiconductor substrate and on opposite sides of the semiconductor fin.

7. The FINFET of claim 1 wherein the base semiconductor monolayers comprise silicon.

8. The FINFET of claim 1 wherein the at least one non-semiconductor monolayer comprises oxygen.

9. The FINFET of claim 4 wherein the lower region comprises silicon; and wherein the upper region comprises silicon germanium.

10. The FINFET of claim 4 wherein the lower region comprises silicon germanium; and wherein the upper region comprises silicon.

11. The FINFET of claim 5 wherein the metal contact comprises at least one of titanium, cobalt, nickel and platinum.

12. A FINFET comprising:
    a semiconductor fin;
    spaced apart source and drain regions in the semiconductor fin with a channel region extending therebetween;
    a source dopant diffusion blocking superlattice extending through the source region to divide the source region into a lower source region and an upper source region with the upper source region having a same conductivity and higher dopant concentration than the lower source region;
    a drain dopant diffusion blocking superlattice extending through the drain region to divide the drain region into a lower drain region and an upper drain region with the upper drain region having a same conductivity and higher dopant concentration than the lower drain region;
    the upper drain region and upper source region each being raised above an upper surface of the semiconductor layer;

each of the source dopant diffusion blocking superlattice and drain dopant diffusion blocking superlattice comprising a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and a gate on the channel region.

13. The FINFET of claim 12 wherein the lower drain region comprises a different material than the upper drain region; and the lower source region comprises a different material than the upper source region.

14. The FINFET of claim 12 further comprising a metal source contact on the upper source region, and a metal drain contact on the upper drain region.

15. The FINFET of claim 12 further comprising a semiconductor substrate from which the semiconductor fin extends vertically upward, and an insulator on the semiconductor substrate and on opposite sides of the semiconductor fin.

16. The FINFET of claim 13 wherein the lower source and drain regions comprise silicon; and wherein the upper source and drain regions comprise silicon germanium.

17. The FINFET of claim 13 wherein the lower source and drain regions comprise silicon germanium; and wherein the upper source and drain regions comprise silicon.

18. The FINFET of claim 14 wherein the metal source and drain contacts comprise at least one of titanium, cobalt, nickel and platinum.

19. A FINFET comprising:

a semiconductor fin;

spaced apart source and drain regions in the semiconductor fin with a channel region extending therebetween;

a source dopant diffusion blocking superlattice extending through the source region to divide the source region into a lower source region and an upper source region with the upper source region having a same conductivity and higher dopant concentration than the lower source region;

a drain dopant diffusion blocking superlattice extending through the drain region to divide the drain region into a lower drain region and an upper drain region with the upper drain region having a same conductivity and higher dopant concentration than the lower drain region;

each of the source dopant diffusion blocking superlattice and drain dopant diffusion blocking superlattice comprising a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;

a gate on the channel region; and a metal source contact on the upper source region, and a metal drain contact on the upper drain region;

wherein the lower drain region comprises a different material than the upper drain region, and the lower source region comprises a different material than the upper source region.

20. The FINFET of claim 19 wherein the lower source and drain regions comprise silicon; and wherein the upper source and drain regions comprise silicon germanium.

21. The FINFET of claim 19 wherein the lower source and drain regions comprise silicon germanium; and wherein the upper source and drain regions comprise silicon.

22. The FINFET of claim 19 wherein the metal source and drain contacts comprise at least one of titanium, cobalt, nickel and platinum.

* * * * *